(12) United States Patent
Kasai

(10) Patent No.: US 8,783,890 B2
(45) Date of Patent: Jul. 22, 2014

(54) ILLUMINATION DEVICE, DISPLAY DEVICE, TELEVISION RECEIVING DEVICE, AND LED LIGHT SOURCE UTILIZING SQUARE SHAPED EMISSION DISTRIBUTIONS

(75) Inventor: Nobuhiro Kasai, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/805,731

(22) PCT Filed: Apr. 21, 2011

(86) PCT No.: PCT/JP2011/059787
§ 371 (c)(1),
(2), (4) Date: Dec. 20, 2012

(87) PCT Pub. No.: WO2012/002029
PCT Pub. Date: Jan. 5, 2012

(65) Prior Publication Data
US 2013/0093963 A1  Apr. 18, 2013

(30) Foreign Application Priority Data
Jul. 1, 2010 (JP) .................................. 2010-150782

(51) Int. Cl.
*F21V 5/04* (2006.01)

(52) U.S. Cl.
USPC ..... 362/97.2; 362/97.1; 362/235; 362/311.02

(58) Field of Classification Search
USPC .......... 313/498–512; 362/607, 635, 612–613, 362/97.2
See application file for complete search history.

(56) References Cited

U.S. PATENT DOCUMENTS

| | | | |
|---|---|---|---|
| 7,780,306 B2 * | 8/2010 | Hoshi | 362/97.1 |
| 7,828,456 B2 * | 11/2010 | Boyer et al. | 362/153.1 |
| 2006/0221592 A1 | 10/2006 | Nada et al. | |
| 2008/0031011 A1 * | 2/2008 | Hayashi et al. | 362/617 |
| 2008/0048193 A1 | 2/2008 | Yoo et al. | |
| 2009/0207586 A1 | 8/2009 | Arai et al. | |
| 2012/0268949 A1 * | 10/2012 | Parkyn | 362/327 |

FOREIGN PATENT DOCUMENTS

| | | | |
|---|---|---|---|
| JP | 2006236814 A | * | 9/2006 |
| JP | 2006-286906 A | | 10/2006 |
| JP | 2007-108547 A | | 4/2007 |
| JP | 2008-004415 A | | 1/2008 |
| JP | 2008-053691 A | | 3/2008 |
| JP | 2008-130909 A | | 6/2008 |
| JP | 2009-192915 A | | 8/2009 |
| JP | 2009-212287 A | | 9/2009 |
| JP | 2010-015898 A | | 1/2010 |

* cited by examiner

*Primary Examiner* — Tracie Y Green
(74) *Attorney, Agent, or Firm* — Lowe Hauptman & Ham, LLP

(57) ABSTRACT

Disclosed are an illumination device to be located immediately below an object to be illuminated, wherein a plurality of point-like light sources are arranged, and a display device provided with the illumination device. Even in a structure wherein the light emitted from point-like light sources is diffused and planarly emitted, in order to provide an illumination device which can uniformly and planarly emit the light without reducing the light intensity at the overlapped portion of the light emitted from the point-like light sources, point-like light sources (LED light sources) each diffusing the light to be emitted in a square-shaped light emission distribution, and an illumination device (LED backlight device) wherein the point-like light sources are arranged in a planar manner so that the square-shaped light emission distributions of the light diffused by the point-like light sources are overlapped in parallel.

17 Claims, 11 Drawing Sheets

ILLUMINATION DEVICE, DISPLAY DEVICE, TELEVISION RECEIVING DEVICE, AND LED LIGHT SOURCE UTILIZING SQUARE SHAPED EMISSION DISTRIBUTIONS

RELATED APPLICATIONS

The present application is a National Phase of International Application Number PCT/JP2011/059787, filed Apr. 21, 2011, and claims priority from, Japanese Application Number 2010-150782, filed Jul. 1, 2010.

TECHNICAL FIELD

The present invention relates to an illumination device which illuminates a liquid crystal panel from the backside, a display device including the illumination device, a television receiving device equipped with the display device, and an LED light source used for the illumination device.

BACKGROUND ART

Recent years, an illumination device using a light emitting diode (LED) having long life and small power consumption that is said to be environmentally friendly has become commercially practical along with improvement of light emission efficiency and increase of light emission intensity. In addition, since development of a blue color LED chip, there are developed a white color LED light source which emits white color light by combination of the blue color LED chip and a fluorescent material which emits excitation light having a predetermined wavelength excited by the light from the LED chip, and a white color LED light source which synthesizes white color light using three primary color LED chips including the blue color LED chip, a green color LED chip, and a red color LED chip.

Therefore, as a backlight of a liquid crystal display device or the like, there is used an illumination device (LED backlight device) in which the white color LED light sources are arranged. In addition, as a backlight of a liquid crystal display device or the like, there are known a direct type backlight device in which the light sources are disposed behind the display screen and an edge-light type backlight device in which the light sources are disposed on lateral sides of the display screen, a light guide plate is disposed behind the display screen, light enters the light guide plate from the lateral sides of the display screen, and the light is reflected inside the light guide plate so as to be emitted from a light emission surface of the light guide plate in a planar manner.

Because the edge-light type backlight device has a structure in which a light source portion is disposed on the lateral side of the display screen while a plate-like light guide plate is disposed behind the display screen, it is easy to be thin and is preferable for realizing a thinner liquid crystal display device or the like. On the other hand, the direct type backlight device has a structure in which the light source is disposed behind the display screen and directly illuminates the same, and hence it is easy to realize high luminance illumination and is preferable because light emission luminance can be easily controlled for each area.

In addition, each LED light source is constituted of an LED package in which the LED chip is mounted on a sub mount substrate and is sealed by transparent resin or transparent resin containing a predetermined fluorescent material to form the package. A plurality of the LED packages are integrally arranged on an LED mounting substrate to form a module, which is a light emission module (LED module) having a predetermined shape.

In addition, in the direct type backlight device, in order to diffuse light emitted from the LED light sources to be uniform, optical members such as a diffusing plate and a lens sheet are disposed. An example of the liquid crystal display device including such the backlight device is described with reference to FIG. 12.

As illustrated in the diagram, a liquid crystal display device 69 includes a liquid crystal panel 59, an LED backlight device 49 which supplies light to the liquid crystal panel 59, and a housing HG (a front housing HG1 and a back housing HG2) which sandwich these members.

The liquid crystal panel 59 includes an active matrix substrate 51 including switching elements such as thin film transistors (TFTs) and an opposing substrate 52 which is opposed to the active matrix substrate 51, which are adhered to each other with a seal material (not shown). Then, liquid crystal (not shown) is injected into a gap between the substrates 51 and 52.

Note that polarizing films 53 are attached to the light receiving plane side of the active matrix substrate 51 and the light emitting side of the opposing substrate 52. Then, the above-mentioned liquid crystal display panel 59 displays an image by utilizing a change of transmittance due to tilt of liquid crystal molecules.

The LED backlight device 49 disposed immediately below the liquid crystal display panel 59 includes an LED module MJ, a backlight chassis 41, a reflection sheet 42, a diffusing plate 43, a prism sheet 44, and a lens sheet 45. The LED module MJ is constituted of a plurality of point-like light sources 1 mounted on a mounting plane 21U of an LED mounting substrate 21.

The LED mounting substrate 21 is a plate-like and rectangular substrate having the mounting plane 21U on which a plurality of electrodes (not shown) are arranged. Further, the point-like light sources 1 as packages of LED light sources, for example, are mounted on the electrodes. Each of the point-like light sources (LED light sources) 1 includes a sub mount substrate on which an LED chip is mounted. Then, the electrode and the LED chip are electrically connected to each other via the sub mount substrate.

Note that a resist film (not shown) to be a protective film is formed on the mounting plane 21U of the LED mounting substrate 21. The resist film has white color having reflecting properties, for example. It is because even if light enters the resist film, the light is reflected by the resist film and is directed to the outside, and hence a cause of light intensity unevenness due to light absorption by the mounting substrate 21 is canceled.

In addition, in the illustrated LED backlight device 49, for example, there are mounted relatively short mounting substrates 21, on each of which five point-like light sources 1 are mounted in a row, and relatively long mounting substrates 21, on each of which eight point-like light sources 1 are mounted in a row.

In this way, the row of five point-like light sources 1 and the row of eight point-like light sources 1 are arranged to make a row of thirteen point-like light sources 1, and further the two types of mounting substrates 21 are arranged also in a direction crossing (perpendicular to) the direction in which the thirteen point-like light sources 1 are arranged (Note that the point-like light sources 1 are arranged at equal spaces). In addition, the arrangement pattern and the number of the arranged point-like light sources are appropriately changed in accordance with a size of the screen, required luminance, and the like.

Thus, the point-like light sources 1 are arranged in a lattice (namely, the LED modules MJ are arranged in a planar manner), and light rays from the point-like light sources 1 are mixed to form planar light (Note that for convenience sake, the direction in which different types of mounting substrates 21 are arranged is referred to as an X direction, while the direction in which the same type of mounting substrates 21 are arranged is referred to as a Y direction, and the direction perpendicular to the X direction and the Y direction is referred to as a Z direction).

The backlight chassis 41 is a box-like member, for example, and houses a plurality of LED modules MJ which are spread over on a base 41B thereof. Note that the base 41B of the backlight chassis 41 and the LED mounting substrate 21 of the LED module MJ are connected by means of rivet (not shown) or the like. In addition, the reflection sheet 42, the diffusing plate 43, the prism sheet 44, and the lens sheet 45 are stacked in this order on the backlight chassis 41.

The reflection sheet 42 is an optical sheet having a reflection surface 42U and covers the plurality of LED modules MJ so that the backside of the reflection surface 42U faces the same. However, the reflection sheet 42 has through holes 42H at positions corresponding to the point-like light sources 1 so that the light emission surfaces of the point-like light sources 1 are exposed from the reflection surface 42U.

Then, when a part of light emitted from the point-like light source 1 propagates toward the base 41B of the backlight chassis 41, the light is reflected by the reflection surface 42U of the reflection sheet 42 so as to propagate to separate from the base 41B. Therefore, because the reflection sheet 42 exists, a loss of light from the point-like light sources 1 is suppressed, and the light is directed toward the diffusing plate 43 opposed to the reflection surface 42U.

The diffusing plate 43 is an optical sheet overlaying the reflection sheet 42 so as to diffuse light emitted from the LED module MJ and the reflection light from the reflection sheet 42U. In other words, the diffusing plate 43 diffuses the planar light formed by the plurality of LED modules MJ (namely, the plurality of point-like light sources 1 arranged in a matrix) so that the light reaches the entire region of the liquid crystal display panel 59.

The prism sheet 44 is an optical sheet overlaying the diffusing plate 43. Further, the prism sheet 44 includes triangular prisms, for example, each of which extends in one direction (linearly), and the triangular prisms are arranged in the direction perpendicular to the one direction in the sheet plane. Thus, the prism sheet 44 deflects the light radiated from the diffusing plate 43. Note that the prisms extend in the Y direction in which smaller number of the point-like light sources 1 are arranged and are arranged in the X direction in which larger number of the point-like light sources 1 are arranged.

The lens sheet 45 is an optical sheet overlaying the prism sheet 44. Further, fine particles for refracting and scattering light are dispersed inside the lens sheet 45. Thus, the lens sheet 45 prevents the light from the prism sheet 44 from concentrating locally so as to suppress a difference between bright and dark parts (light intensity unevenness).

Then, the above-mentioned LED backlight device 49 allows the planar light formed by the plurality of LED modules MJ to pass through the plurality of optical sheets 43 to 45 to be supplied to the liquid crystal panel 59. Thus, the non-light emission type liquid crystal panel 59 receives light (backlight light) from the LED backlight device 49 so as to improve its display function.

As described above, in the LED backlight device having the conventional structure, the LED light source is used as the point-like light source, and the plurality of LED light sources are arranged in a lattice, for example, so as to form a planar light emission body. Therefore, various techniques are used for suppressing luminance unevenness and color unevenness due to the LED light sources as the point-like light sources. There are already disclosed a backlight device equipped with a processing portion for adjusting intensity of light emitted immediately above the LED (see, for example, Patent Document 1) and a backlight device equipped with a lens having an optical function for scattering and diffusing light (see, for example, Patent Document 2).

PRIOR ART DOCUMENTS

Patent Documents

Patent Document 1: JP-A-2006-286906
Patent Document 2: JP-A-2009-192915

DISCLOSURE OF THE INVENTION

Problem to be Solved by the Invention

Even by the structure in which a plurality of LED light sources as the point-like light sources are arranged in a lattice, it is possible to obtain uniform light by diffusing light from each of the LED light sources and by mixing light rays from neighboring light sources. However, if the light from each of the LED light sources is diffused simply in a concentric manner about the LED light source, there is a problem that a gap with decreased light intensity occurs in an overlapping part of diffused light rays from four LED light sources arranged in a lattice, for example.

In particular, in a direct type illumination device (LED backlight device) having a structure in which a small number of high power LED light sources are arranged for realizing high luminance and low cost, it is important to diffuse light from each of the point-like light sources (LED light sources) and to equalize light intensity at the overlapping part of diffused light rays.

Therefore, when a plurality of point-like light sources (LED light sources) are arranged in a lattice, it is desired that light intensity in the boundary part in which the light rays are mixed should not be decreased. In addition, it is desired to use the illumination device (LED backlight device) enabling uniform planar emission so that display quality of the liquid crystal display device is improved.

Therefore, in view of the above-mentioned problem, it is an object of the present invention to provide a direct type illumination device having a plurality of point-like light sources arranged and a display device including the illumination device, in which even in a structure of diffusing light from each of the point-like light sources so as to realize planar emission, light intensity is not decreased at an overlapping part of light rays from the plurality of point-like light sources so as to enable uniform planar emission.

Means for Solving the Problem

In order to achieve the above-mentioned object, the present invention provides an illumination device including a plurality of point-like light sources, and a mounting substrate on which the point-like light sources are mounted, in which light emitted from the point-like light source is diffused to have a square-shaped light emission distribution.

With this structure, light from each point-like light source is diffused to have a square shape. Therefore, the plurality of point-like light sources can be arranged so that light rays from light sources neighboring in up and down direction and in left and right direction are arranged to be parallel to each other. In addition, therefore, the light emission distributions are overlapped in parallel so that light rays are mixed at periphery of the diffused light of each point-like light source. Thus, it is possible to provide the illumination device which does not generate a decreased luminance portion so that light intensity is not decreased at an overlapped portion of light rays, and enables uniform planar emission.

In addition, the present invention provides the illumination device having the structure described above, in which the plurality of point-like light sources are arranged linearly in a longitudinal direction of the mounting substrate so that the square-shaped light emission distributions are overlapped in parallel. With this structure, because the point-like light sources are linearly arranged, the light emission distributions can be easily overlapped in parallel.

In addition, the present invention provides the illumination device having the structure described above, in which the plurality of point-like light sources are arranged in a lattice, light emission distributions of the point-like light sources neighboring in up and down direction and in left and right direction are overlapped in parallel at each side of the square shape, and diffused light rays of four point-like light sources arranged in a lattice overlap with each other also at the center thereof. With this structure, because light emission distributions of the plurality of point-like light sources arranged in a lattice are overlapped in parallel, even if the illumination device is a light emission device having large area, light intensity is not decreased in the overlapping portion so that uniform planar emission can be performed.

In addition, the present invention provides the illumination device having the structure described above, in which the plurality of point-like light sources are mounted at equal spaces on the mounting substrate. With this structure, by arranging the point-like light sources for diffusing in a predetermined range at equal spaces, peripheries of the diffused light rays can be securely overlapped. Therefore, it is possible to provide the illumination device in which light intensity at an overlapping portion of light rays from the plurality of point-like light sources is not decreased so that uniform planar emission can be performed.

In addition, the present invention provides the illumination device having the structure described above, in which a plurality of mounting substrates are arranged in a plurality of rows along a longitudinal direction. With this structure, it is possible to provide the illumination device enabling uniform planar emission by using the mounting substrates, in which light intensity in the overlapping portion of light rays from the plurality of point-like light sources is not decreased, even in a light emission device having large area.

In addition, the present invention provides the illumination device having the structure described above, in which the plurality of point-like light sources are arranged in a lattice on the plurality of arranged mounting substrates. With this structure, because the point-like light sources are arranged in a lattice in a state where the plurality of substrates are arranged, it is possible to provide the illumination device enabling uniform planar emission in which light emission distributions of the plurality of point-like light sources arranged in a lattice are overlapped in parallel so that light intensity is not decreased.

In addition, the present invention provides the illumination device having the structure described above, in which the plurality of point-like light sources are arranged in a lattice on the mounting substrates on which the point-like light sources are mounted. With this structure, because of being arranged in a lattice on the mounting substrate, it is possible to provide the illumination device enabling uniform planar emission in which light emission distributions of the plurality of point-like light sources arranged in a lattice are overlapped in parallel so that light intensity is not decreased.

In addition, the present invention provides the illumination device having the structure described above, in which the point-like light source is constituted of an LED package including an LED chip as a light source, a sub mount substrate on which the LED chip is mounted, and a sealing resin for sealing the LED chip, and emitted light is diffused to have a square-shaped light emission distribution. With this structure, because light from the light source is diffused to have a square shape, when the plurality of LED light sources are arranged planarly in a matrix, for example, they are arranged so that the light emission distributions thereof are overlapped in parallel so that the light rays are mixed at the periphery of the diffused light of each LED light source. Thus, it is possible to provide the illumination device enabling uniform planar emission which does not generate a decreased luminance portion so that light intensity is not decreased between the plurality of LED light sources.

In addition, the present invention provides the illumination device having the structure described above, in which the point-like light source includes a diffusing lens which diffuses light emitted through the LED chip and the sealing resin to have a square-shaped light emission distribution. With this structure, it is possible to obtain the light emission distribution diffused in a square shape in a desired range by a shape of the diffusing lens.

In addition, the present invention provides the illumination device having the structure described above, in which the sealing resin is set in a shape such that the light emitted from the LED chip is diffused to have a square-shaped light emission distribution. With this structure, it is possible to obtain the light emission distribution diffused in a square shape in a desired range by the set shape of the sealing resin.

In addition, the present invention provides the illumination device having the structure described above, in which a plurality of LED chips are mounted on the sub mount substrate via a support base having inclined planes so that the plurality of LED chips have different light emission directions. With this structure, light rays from the individual LED chips can be emitted and diffused in different directions. Therefore, by arranging the plurality of LED light sources at a predetermined pitch in a planar manner, mixing light intensity is increased, and hence it is possible to achieve high quality planar emission without light intensity unevenness as a whole.

In addition, the present invention provides the illumination device having the structure described above, in which the support base is an inverted V-shaped support base having two inclined planes. With this structure, two LED chips are disposed on the two inclined planes of the inverted V-shape, so that a light emission distribution diffused in a desired range can be obtained.

In addition, the present invention provides the illumination device having the structure described above, in which the support base is a trapezoidal support base having a flat top portion of the inverted V-shape, and a third LED chip is further disposed on the flat top portion. With this structure, three LED chips are disposed on total three planes including the two inclined planes of the inverted V-shape and the top portion, so that a light emission distribution diffused in a desired range can be obtained.

In addition, the present invention provides the illumination device having the structure described above, in which the support base is a triangular pyramid support base having three inclined planes. With this structure, three LED chips are disposed on the three inclined planes of the inverted V-shape, so that a light emission distribution diffused in a desired range can be obtained.

In addition, the present invention provides the illumination device having the structure described above, in which the triangular pyramid has a flat top portion, and a fourth LED chip is further disposed on the flat top portion. With this structure, four LED chips are disposed on total four planes including the three inclined planes of the triangular pyramid and the top portion, so that a light emission distribution diffused in a desired range can be obtained.

In addition, the present invention provides the illumination device having the structure described above, in which the support base is a square pyramid support base having four inclined planes. With this structure, four LED chips are disposed on the four inclined planes of the square pyramid, and hence it is possible to obtain the light emission distribution diffused in a square shape in a desired range.

In addition, the present invention provides the illumination device having the structure described above, in which the square pyramid has a flat top portion, and a fifth LED chip is further disposed on the flat top portion. With this structure, five LED chips are disposed on total five planes including the four inclined planes of the square pyramid and the top portion, and hence it is possible to obtain the light emission distribution diffused in a square shape in a desired range.

In addition, the present invention provides the illumination device having the structure described above, in which the LED chip is a predetermined LED chip which emits first light of monochrome, and the sealing resin contains a predetermined fluorescent material for emitting second light and/or third light having different colors excited by the first light so that white color light is emitted as mixture of the light colors. With this structure, it is possible to provide the illumination device including the LED light sources enabling white color planar emission.

In addition, the present invention provides the illumination device having the structure described above, in which the LED chip is a blue color LED chip, and the fluorescent material is a fluorescent material having a light emission peak in a yellow color region. With this structure, by using the blue color LED chip and the sealing resin to which the yellow color fluorescent material is added, it is possible to provide the illumination device including the LED light sources enabling white color planar emission with uniform light intensity.

In addition, the present invention provides the illumination device having the structure described above, in which the LED chip is a blue color LED chip, and the fluorescent material is a fluorescent material having light emission peaks in a green color region and in a red color region. With this structure, by using the blue color LED chip and the sealing resin to which the green color fluorescent material and the red color fluorescent material are added, it is possible to provide the illumination device including the LED light sources enabling white color planar emission with uniform light intensity.

In addition, the present invention provides the illumination device having the structure described above, in which the point-like light source includes a blue color LED chip to which a fluorescent material having a light emission peak in a green color region is added, and a red color LED chip, which are combined so as to emit white color light. With this structure, too, it is possible to provide the illumination device including the LED light sources enabling white color planar emission.

In addition, the present invention provides the illumination device having the structure described above, in which the LED chip includes a blue color LED chip emitting blue color light, a red color LED chip emitting red color light, and a green color LED chip emitting green color light, so as to emit white color light as mixture of the light colors. With this structure, it is possible to provide the illumination device including the LED light sources enabling uniform white color planar emission, by mounting the LED chips of three primary colors so as to obtain a light emission distribution in which the light rays are diffused in a square shape in desired ranges.

In addition, the present invention provides a display device including an illumination device, and a display panel which performs a display by using light from the illumination device. With this structure, it is possible to provide a display device having improved display quality equipped with the illumination device having uniform light emission luminance. In addition, because light rays of the individual point-like light sources are diffused, it is possible to reduce the number of the light sources to be mounted, and hence it is possible to provide the display device that can reduce cost.

In addition, the present invention provides the display device having the structure described above, in which the display panel is a liquid crystal panel using liquid crystal. With this structure, it is possible to provide the liquid crystal display device having improved display quality equipped with the illumination device having uniform light emission luminance.

In addition, the present invention provides a television receiving device including the display device. With this structure, it is possible to provide the television receiving device that does not generate a decreased luminance portion so that light emission luminance can be stabilized and reliability can be improved.

In addition, the present invention provides an LED light source for use as the point-like light source included in the illumination device. The LED light source is constituted of an LED package including an LED chip as a light source, a sub mount substrate on which the LED chip is mounted, and a sealing resin for sealing the LED chip, in which emitted light is diffused to have a square-shaped light emission distribution. With this structure, because light from the LED light source is diffused to have a square shape, when the plurality of LED light sources are arranged planarly in a matrix, for example, they are arranged so that the light emission distributions thereof are overlapped in parallel so that the light rays are mixed at the periphery of the diffused light of each LED light source. Thus, it is possible to provide the LED light source enabling uniform planar emission which does not generate a decreased luminance portion so that light intensity is not decreased between the plurality of LED light sources.

In addition, the present invention provides the LED light source having the structure described above, including a diffusing lens for diffusing light emitted via the LED chip and the sealing resin to have a square-shaped light emission distribution, and/or the sealing resin set in a shape for diffusing light emitted from the LED chip to have a square-shaped light emission distribution. With this structure, it is possible to obtain the light emission distribution diffused in a square shape in a desired range by a shape of the diffusing lens, and/or the set shape of the sealing resin.

Effects of the Invention

According to the present invention, because light rays from the individual point-like light sources are diffused to have a square shape, by arranging the plurality of point-like light sources so that the square-shaped diffused light rays are overlapped in parallel, it is possible to provide the illumination device enabling uniform planar emission, in which light intensity in the overlapping portion of light rays from the plurality of point-like light sources is not decreased, even in a structure in which light rays from the light sources are diffused so as to realize planar emission. Therefore, by using this illumination device, it is possible to provide the display device and the television receiving device having improved display quality.

DESCRIPTION OF EMBODIMENTS

Hereinafter, an embodiment of the present invention is described with reference to the drawings. In addition, members having the same structure are denoted by the same numeral or symbol, and detailed description thereof is appropriately omitted.

A point-like light source used for an illumination device according to the present invention is an LED light source, for example, and is constituted of an LED package in which an LED chip, a sub mount substrate for mounting the LED chip, and sealing resin for sealing the LED chip are packaged. In addition, the illumination device according to the present invention is a direct type backlight device used for the above-mentioned liquid crystal display device 69 illustrated in FIG. 12. Therefore, a plurality of LED light sources, each of which is a point-like light source, are arranged in a planar manner so as to form a planar emission body having a predetermined area.

In this way, because the LED light sources as the point-like light sources are arranged in a planar manner so as to form the planar emission body, in order to emit light having uniform luminance and color, light rays emitted from the LED light sources are diffused by a predetermined angle so that light rays from neighboring light sources are mixed.

Therefore, depending on an arrangement pattern of the LED light sources and a light diffusion pattern of each LED light source, the mixed state of the light rays becomes good or bad. Therefore, in order to be adapted to the arrangement pattern in which the plurality of LED light sources are arranged at a predetermined pitch in vertical and horizontal directions of the planar emission body, the LED light source according to this embodiment diffuses the emitted light to have a square-shaped light emission distribution. In addition, in the illumination device according to this embodiment, the plurality of LED light sources are arranged at a predetermined pitch so that peripheries of the square-shaped light emission distributions are overlapped in parallel.

Therefore, when the plurality of LED light sources are planarly arranged in a matrix, in a lattice or in a staggered manner, the square-shaped light emission distributions are set to overlap in parallel along the row. In this way, the light emission distributions are securely overlapped at peripheral regions thereof so that there doesn't occur a decreased light intensity portion in which light intensity is decreased without the overlapping.

In particular, when arranging in a lattice, it is preferred that light emission distributions of the LED light sources neighboring in up and down direction and in left and right direction should be overlapped in parallel at each side of the square-shape, and diffused light rays should be overlapped also in the center at which diagonal lines of four LED light sources arranged in a lattice are intersected.

Figure 1A:
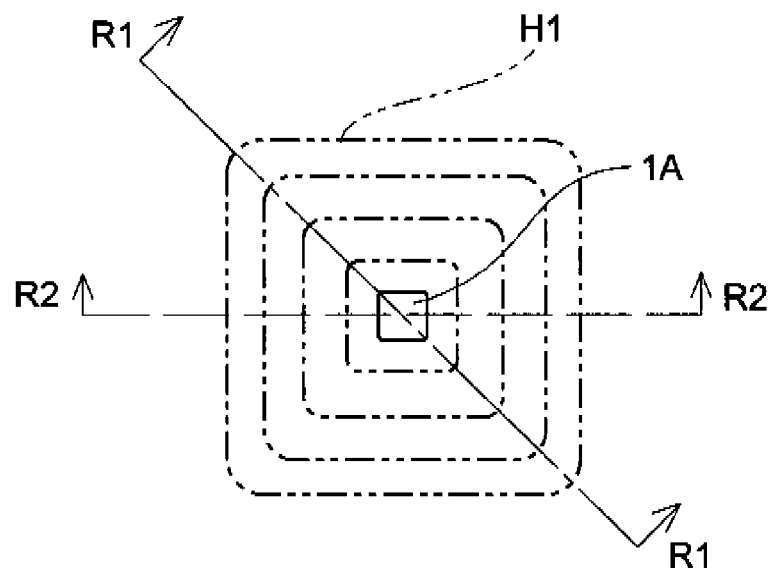
FIG. 1A is a schematic explanatory diagram illustrating a light emission distribution emitted from a point-like light source of an illumination device and diffused in a square shape according to the present invention.
Figure 1B:
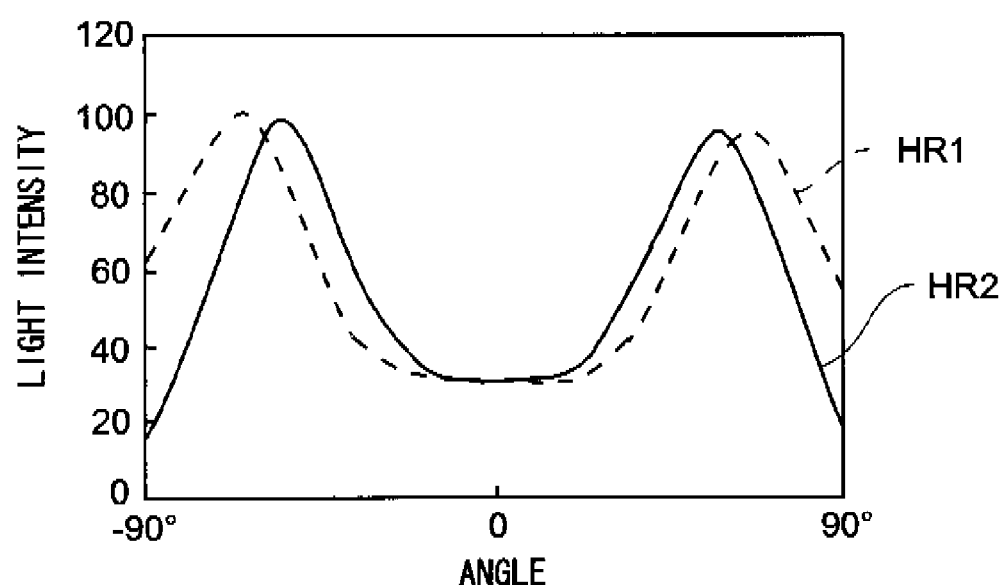
FIG. 1B is a diagram illustrating directivity characteristics of the light emission distribution of FIG. 1A.

Next, with reference to FIGS. 1A and 1B, a light emission distribution of the LED light source according to this embodiment is described. FIG. 1A is a schematic explanatory diagram illustrating a light emission distribution diffused in a square shape. In addition, FIG. 1B is a diagram illustrating directivity characteristics in which the horizontal axis represents a directivity angle while the vertical axis represents a relative value of light intensity at each directivity angle.

As illustrated in FIG. 1A, the LED light source according to this embodiment 1A has a structure of emitting light in a square-shaped light emission distribution H1 indicated by double dot dashed lines in the diagram. In addition, the directivity characteristics of this square-shaped light emission distribution H1 includes directivity characteristics HR2 on a center line R2-R2 parallel to a side of a square illustrated in FIG. 1B and directivity characteristics HR1 in a diagonal line R1-R1 inclined from the center line R2-R2 by substantially 45 degrees. In this way, the square-shaped light emission distribution H1 can be obtained by diffusing the light emission distribution in the diagonal direction in a larger angle.

As a method of obtaining this square-shaped light emission distribution H1, it is possible to use, for example, a method of using a diffusing lens, a method of disposing a plurality of LED chips so as to be directed in different directions by an inclined base, a method of setting the sealing resin in a shape enabling to diffuse light in a desired direction, and a combination of these methods. These methods are described with reference to FIGS. 2A to 2C.

Figure 2A:
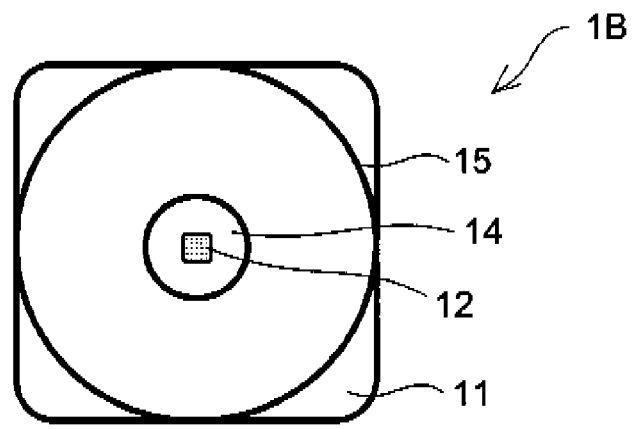
FIG. 2A is a plan view of an LED light source having a conventional structure.

FIG. 2A illuminates an LED light source 1B having a conventional structure that does not have the square-shaped light emission distribution. This LED light source 1B includes a base (for example, a sub mount substrate 11), a LED chip 12, a sealing resin 14, and a diffusing lens 15, which are packaged. In this case, using the diffusing lens 15 having a circular outside shape, emitted light is diffused in an average manner to the entire periphery.

Figure 2B:
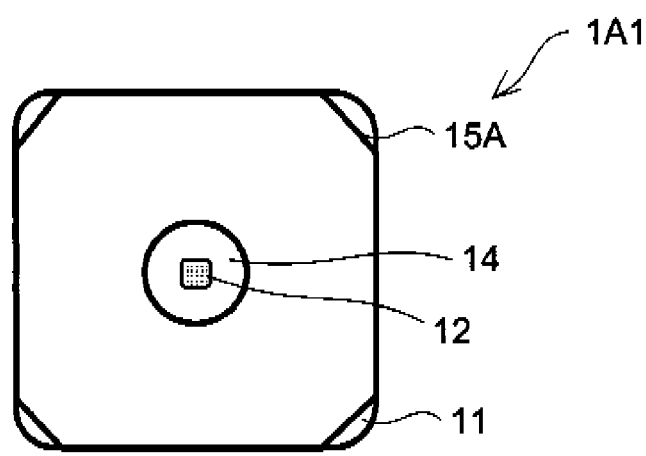
FIG. 2B is a plan view of an LED light source having a structure of the present invention.

In this case, as illustrated in FIG. 2B, instead of the diffusing lens 15, it is possible to use a diffusing lens 15A having a substantially square outside shape and a function of reinforcing emitted light intensity in the diagonal direction so as to constitute an LED light source 1A1. Then, the above-mentioned square-shaped light emission distribution H1 can be obtained.

Figure 2C:
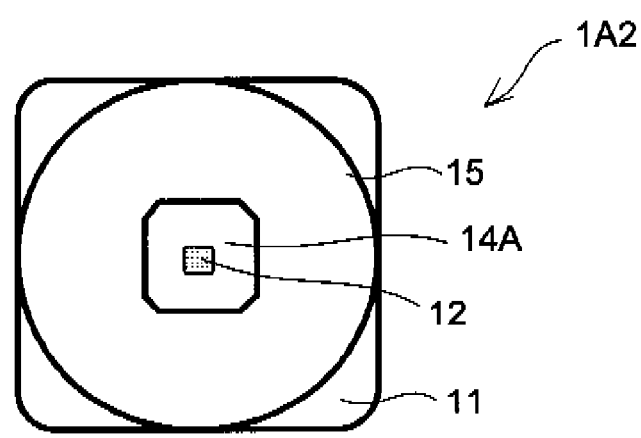
FIG. 2C is a plan view of an LED light source of a variation example.

In addition, as a variation example illustrated in FIG. 2C, instead of the sealing resin 14 of the LED light source 1B of FIG. 2A, it is also possible to use a sealing resin 14A set in a square shape for reinforcing emitted light intensity in the diagonal direction so as to constitute an LED light source 1A2. Thus, the above-mentioned square-shaped light emission distribution H1 can also be obtained.

In addition, the LED light source may include both the sealing resin 14A that reinforces emitted light intensity in the diagonal direction and the diffusing lens 15A. By this combination, it is possible to form the LED light source having a light emission distribution diffused in a desired shape.

In this way, when a plurality of LED light sources, each of which is a point-like light source, are arranged in a planar manner, light rays emitted from the LED light sources are uniformly mixed in the diffused region in accordance with an arrangement pattern, and hence a diffusion pattern having no luminance unevenness and no color unevenness is obtained.

For instance, in the LED light source 1B having the conventional structure illustrated in FIG. 2A, both the sealing resin 14 and the diffusing lens 15 diffuse the emitted light in an average manner to the entire periphery. Therefore, light intensity in the diffused region is different depending on a distance between neighboring LED light sources 1B. For instance, when four LED light sources are arranged in a lattice, the distance in the diagonal direction becomes longer than the distance in the up and down direction or in the left and right direction, and hence light intensity is decreased in the center portion of the lattice in which the diagonal lines are intersected.

Figure 3A:
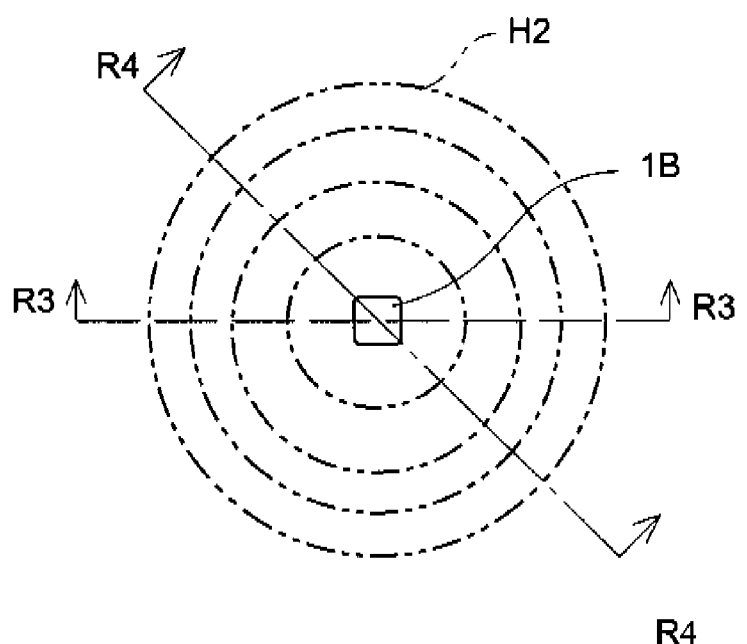
FIG. 3A is a schematic explanatory diagram illustrating a light emission distribution emitted from a conventional LED light source and is diffused in a circular shape.
Figure 3B:
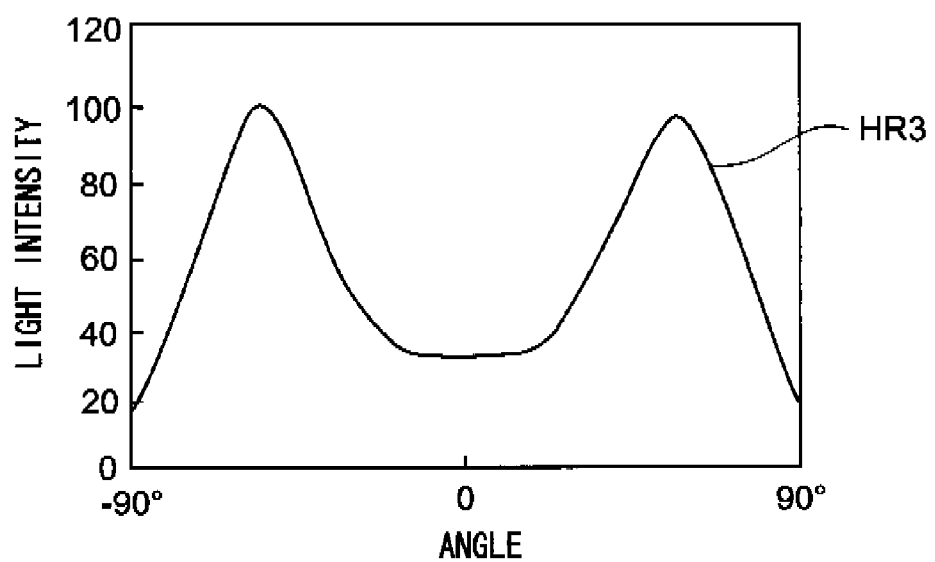
FIG. 3B is a diagram illustrating directivity characteristics of the light emission distribution of FIG. 3A.

The conventional LED light source 1B illustrated in FIG. 3A, which diffuses the emitted light in an average manner to the entire periphery, has a substantially circular light emission distribution H2 indicated by double dot dashed lines in the diagram. Further, in this light emission distribution H2, directivity characteristics on a first center line R3-R3 and directivity characteristics on a second center line R4-R4 inclined from the center line R3-R3 by 45 degrees have the same amplitude, and hence single directivity characteristics HR3 as illustrated in FIG. 3B are obtained.

Figure 4A:
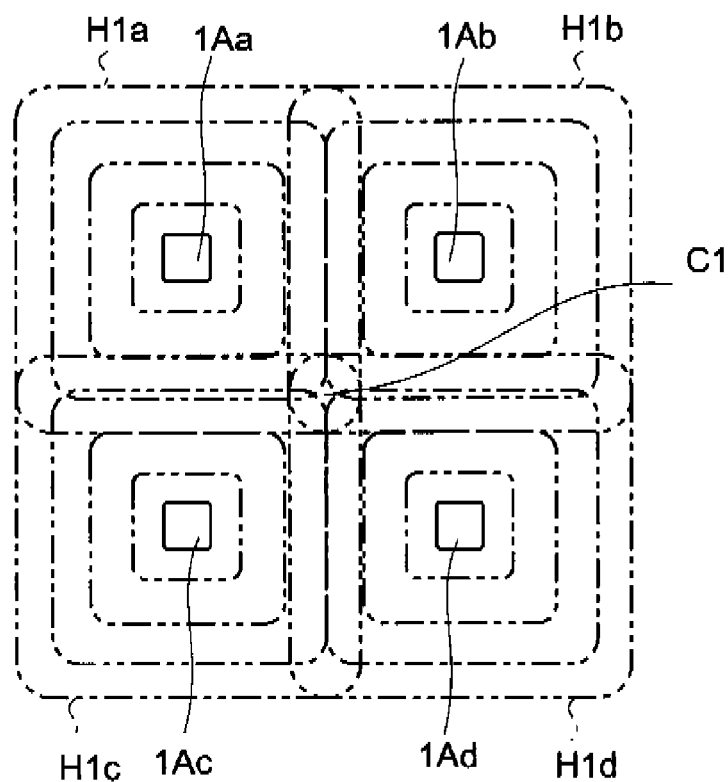
FIG. 4A is a schematic explanatory diagram illustrating a light emission distribution when the LED light sources having the structure of the present invention are arranged in a lattice.
Figure 4B:
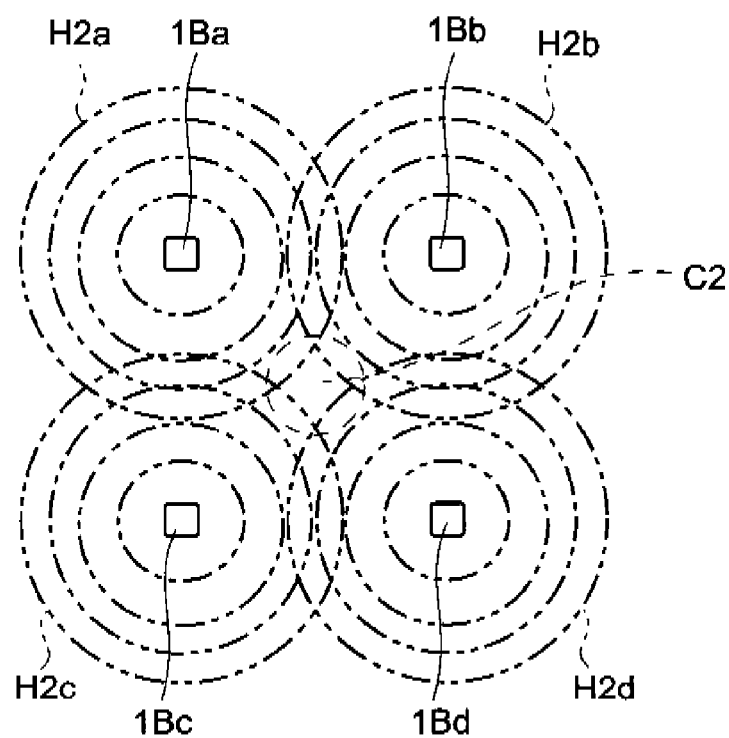
FIG. 4B is a schematic explanatory diagram illustrating a light emission distribution when the LED light sources having the conventional structure are arranged in a lattice.

Therefore, when four LED light sources 1B are arranged in a lattice, as illustrated in FIG. 4B, for example, an LED light source 1Ba and an LED light source 1Bb are arranged in left and right direction, and LED light sources 1Bc and 1Bd are arranged below them, respectively. Then, in the diagram, a light emission distribution H2a of the LED light source 1Ba and a light emission distribution H2b of the LED light source 1Bb, which are separated in left and right direction, have overlapping diffused light, and the light emission distribution H2a of the LED light source 1Ba and a light emission distribution H2c of the LED light source 1Bc, which are separated in up and down direction, have overlapping diffused light. However, the light emission distribution H2a of the LED light source 1Ba and a light emission distribution H2d of the LED light source 1Bd, which are separated in diagonal direction, do not have overlapping diffused light.

In the same manner, the light emission distribution H2b of the LED light source 1Bb and the light emission distribution H2c of the LED light source 1Bc, which are separated in diagonal direction, do not have overlapping diffused light. Therefore, when the four LED light sources 1B (1Ba, 1Bb, 1Bc, and 1Bd), each of which has a circular light emission distribution, are arranged in a lattice, there may occur a decreased light intensity portion C2 (region encircled by a broken line in the diagram) in which diffused light rays of the LED light sources are not overlapped in the center portion in which the diagonal lines are intersected.

However, as indicated by double dot dashed lines in FIG. 4A, when four LED light sources 1A (1Aa, 1Ab, 1Ac, and 1Ad), each of which has the square-shaped light emission distribution H1, are arranged in a lattice, a light emission distribution H1a of the LED light sources 1Aa and a light emission distribution H1b of the LED light source 1Ab, which are neighboring to each other in left and right direction in the diagram, have overlapping diffused side regions, and the light emission distribution H1a of the LED light sources 1Aa and a light emission distribution H1c of the LED light source 1Ac, which are separated in up and down direction, have overlapping diffused side regions. Further, the light emission distribution H1a of the LED light sources 1Aa and a light emission distribution H1d of the LED light source 1Ad, which are separated in diagonal direction, also have overlapping diffused side regions.

In the same manner, the light emission distribution H1b of the LED light source 1Ab and the light emission distribution H1c of the LED light source 1Ac, which are separated in diagonal direction, also have overlapping diffused side regions.

Therefore, in the center portion of the four LED light sources 1A (1Aa, 1Ab, 1Ac, and 1Ad) arranged in a lattice, there occurs a mixed light portion C1 in which diffused light rays of the LED light sources are overlapped.

In this way, if each of the LED light sources has a square-shaped light emission distribution in the arrangement pattern of arranging a plurality of LED light sources in a lattice, when the plurality of LED light sources are planarly arranged in a matrix, the light emission distributions thereof are arranged to overlap in parallel so that the diffused light rays of the LED light sources are mixed at peripheral portions. Then, it is possible to preferably provide the LED light source, in which the decreased luminance portion does not occur between the plurality of LED light sources, light intensity is not decreased, and uniform planar emission can be performed.

Next, a light emission pattern of each LED light source (or light angle distribution, which is hereinafter referred to as directivity), and a light source structure providing diffused light are described with reference to FIGS. 5 to 11.

Figure 5A:
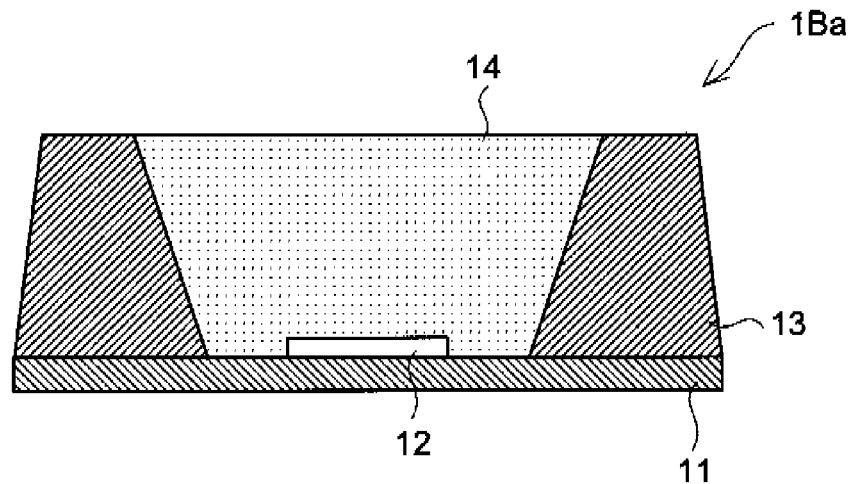
FIG. 5A is a cross-sectional view of the LED light source having the conventional structure.
Figure 5B:
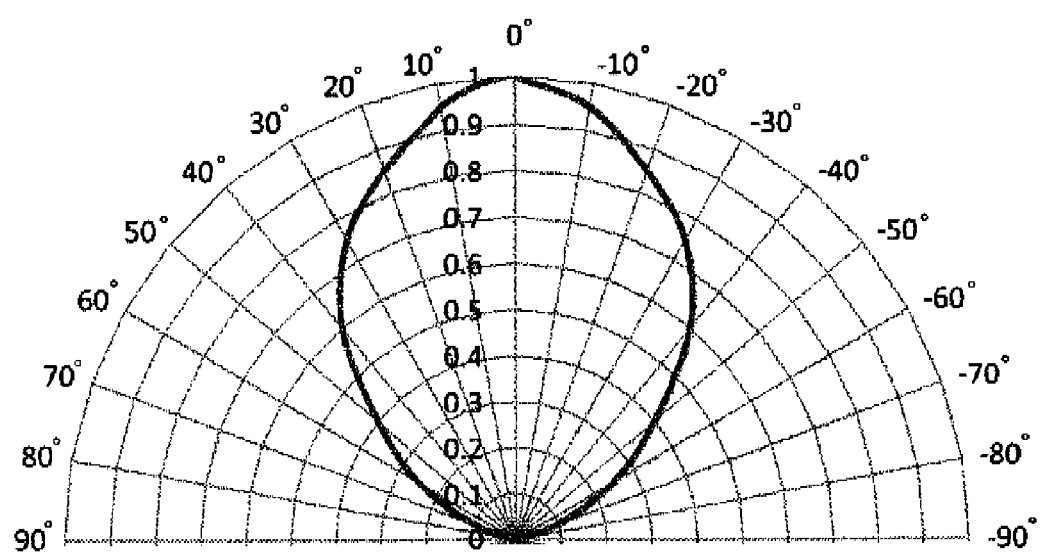
FIG. 5B is a graph illustrating directivity of the LED light source having the conventional structure by using polar coordinates.

FIG. 5A illuminates the LED light source 1Ba having the conventional structure, and FIG. 5B illuminates directivity of this LED light source 1Ba by using polar coordinates. A value in the range of 0 to 1 in the vertical axis of the polar coordinates indicates a relative value of light intensity.

Specifically, the LED light source 1Ba of the conventional structure, in which the LED chip 12, a reflector 13, and the sealing resin 14 are packaged on the base (for example, the sub mount substrate 11), has a largest light intensity at an angle of 0 degrees and the vicinity, and the light is emitted substantially in the direction perpendicular to the mounting plane.

Figure 6A:
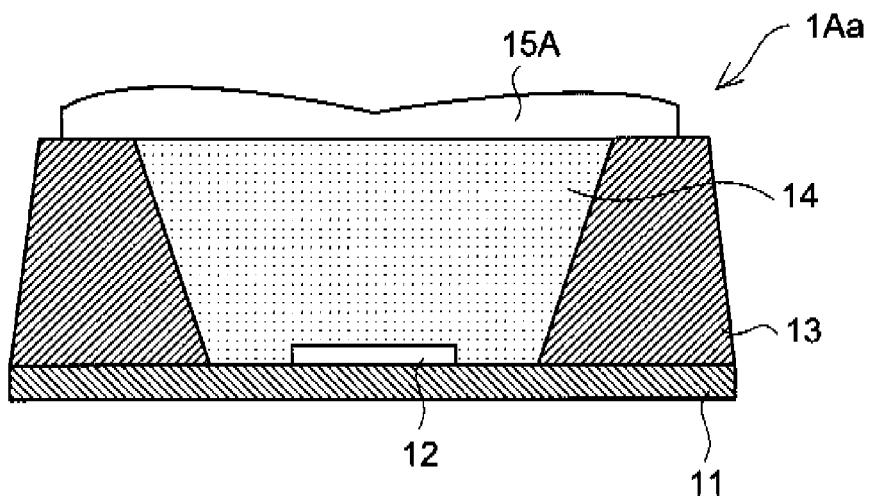
FIG. 6A is a cross-sectional view of an LED light source of a first embodiment according to the present invention.
Figure 6B:
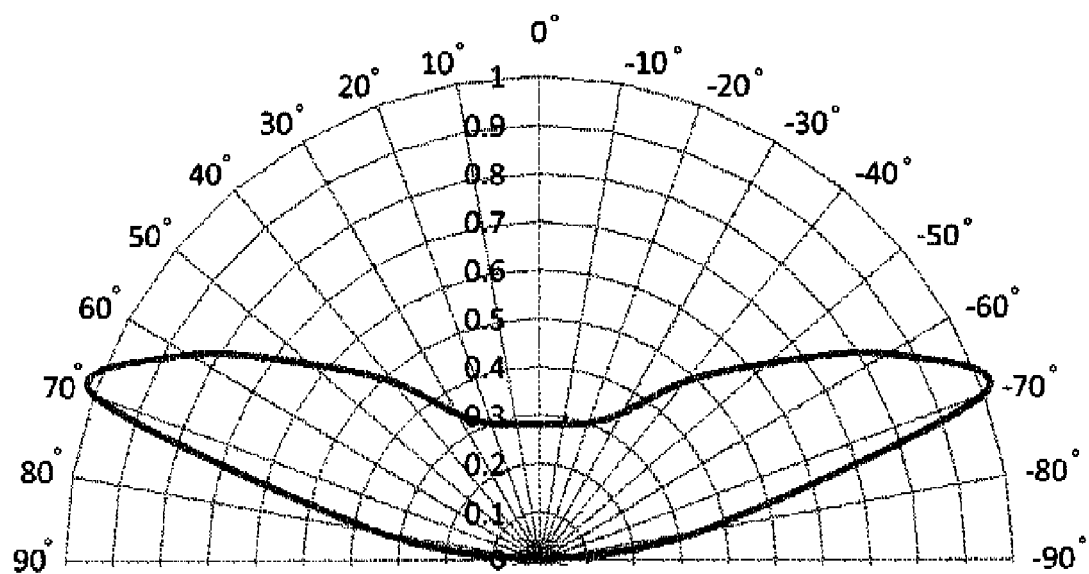
FIG. 6B is a graph illustrating directivity of the LED light source of the first embodiment by using polar coordinates.

However, as a first embodiment illustrated in FIG. 6A, the LED light source 1Aa, which is equipped with the diffusing lens 15A having the function of reinforcing emitted light intensity in the diagonal direction, does not emit light at 0 degrees and the vicinity with respect to the mounting plane but emits light to be close to the mounting plane at ±70° and the vicinity as illustrated in FIG. 6A by polar coordinates. In other words, it is possible to diffuse light in a predetermined direction by the diffusing lens 15A.

Figure 7A:
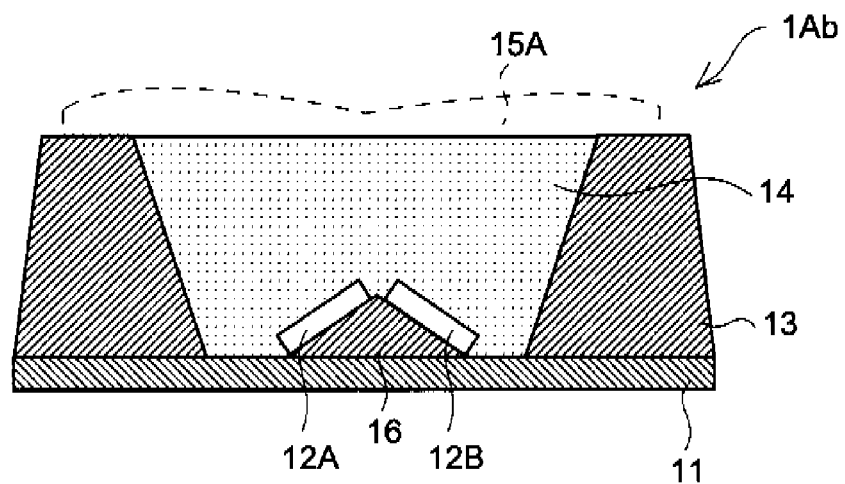
FIG. 7A is a cross-sectional view of an LED light source of a second embodiment according to the present invention.
Figure 7B:
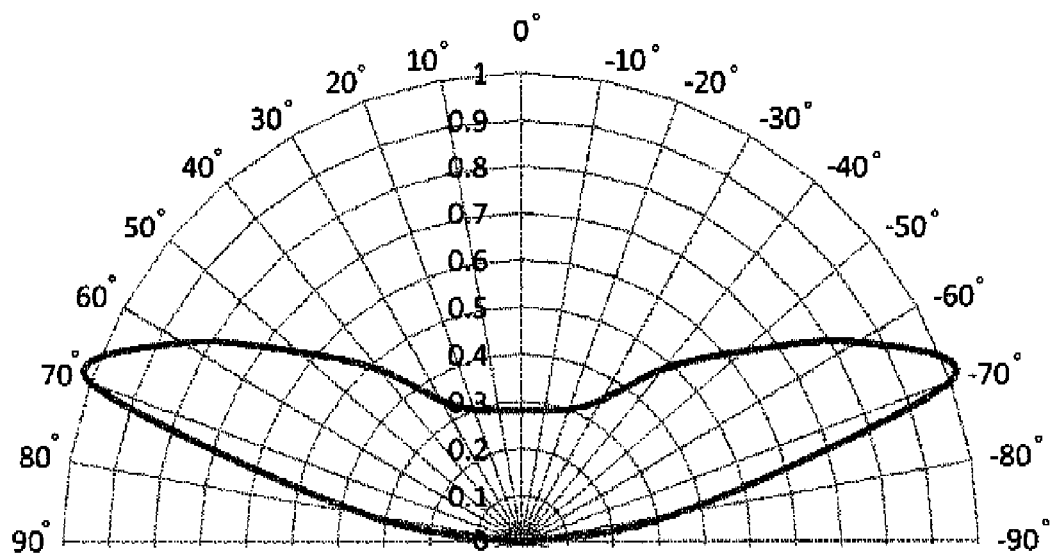
FIG. 7B is a graph illustrating directivity of the LED light source of the second embodiment by using polar coordinates.

In addition, the LED light source 1Ab of a second embodiment illustrated in FIG. 7A has a structure in which a plurality of LED chips 12A and 12B are mounted on the base (sub mount substrate 11) via a support base 16 having inclined planes for emitting light rays from the LED chips in different directions. The LED light source 1Ab having this structure also does not emit light at 0 degrees and the vicinity with respect to the mounting plane but emits light to be close to the mounting plane at ±70° and the vicinity as illustrated in FIG. 7B by polar coordinates. In other words, because the plurality of LED chips emit light rays in different directions by the support base 16, the light can be diffused in a predetermined direction.

In addition, it is possible to dispose the above-mentioned diffusing lens 15A as illustrated by an imaginary line, so as to further reinforce emitted light intensity in the diagonal direction. Thus, a desired square-shaped light emission distribution can be obtained.

The reflector 13 has a function of reflecting light toward a display portion such as a liquid crystal panel, for example. Therefore, even if the diffused light becomes too close to the mounting plane, the light is reflected upward to the display portion so that loss of light is reduced, and hence the light can be effectively used.

As a method of mounting the plurality of LED chips in an inclined manner, there are following methods, for example. In a first example illustrated in FIGS. 8A and 8B, two LED chips 12A and 12B are mounted via an inverted V-shaped support base 16A. In a second example illustrated in FIGS. 9A and 9B, three LED chips 12A, 12B, and 12C are mounted via a trapezoidal support base 16B. In a third example illustrated in FIGS. 10A and 10B, three LED chips 12A, 12B, and 12C are mounted via a triangular pyramid support base 16C. In a fourth example illustrated in FIGS. 11A and 11B, four LED chips 12A, 12B, 12C, and 12D are mounted via a square pyramid support base 16D.

Figure 8A:
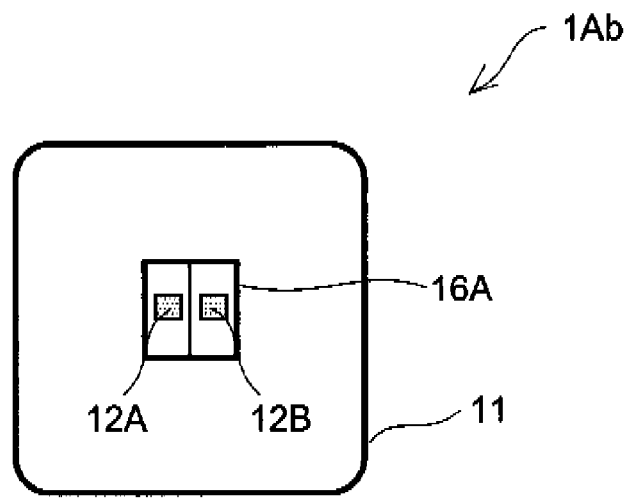
FIG. 8A is a plan view illustrating a first example of a support base according to the present invention.
Figure 8B:
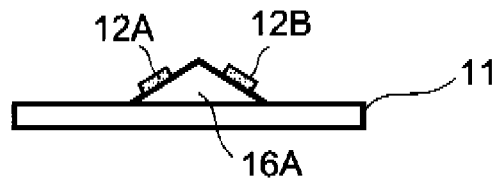
FIG. 8B is a side view of the support base of FIG. 8A.

As illustrated in a plan view of FIG. 8A, the inverted V-shaped support base 16A is attached to the base (sub mount substrate 11) having a square shape in a plan view, for example, and the LED chips 12A and 12B are mounted on the two inclined planes of this inverted V-shape so as to constitute the LED light source 1Ab. Then, as illustrated in a side view of FIG. 8B, the LED chips 12A and 12B are arranged in a state of emitting light rays in directions inclined with respect to the mounting plane of the sub mount substrate 11.

In this way, because the light rays emitted from the LED chips 12A and 12B mounted on the inclined planes are emitted in directions inclined with respect to the mounting plane of the sub mount substrate 11, similarly to the above-mentioned diffused light, the light is not emitted at 0 degrees and the vicinity with respect to the mounting plane but is emitted to be close to the mounting plane by being diffused at a predetermined angle. In other words, because the plurality of LED chips emits light in different directions via the inverted V-shaped support base 16A, it is possible to diffuse light in a predetermined range.

Figure 9A:
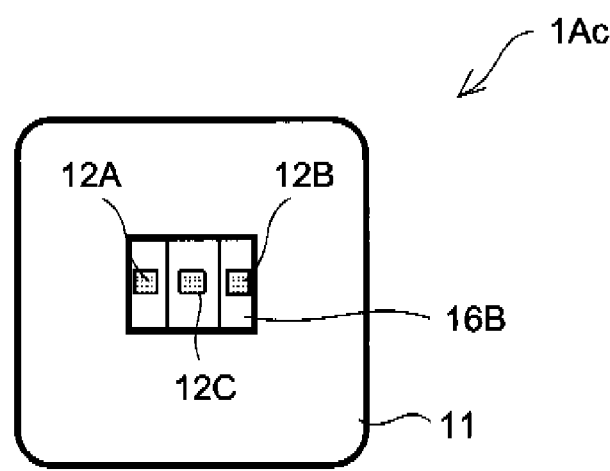
FIG. 9A is a plan view illustrating a second example of the support base according to the present invention.
Figure 9B:
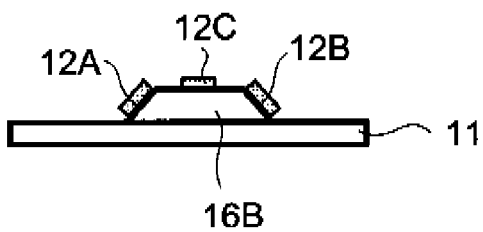
FIG. 9B is a side view of the support base of FIG. 9A.

In addition, as illustrated in a plan view of FIG. 9A and in a side view of FIG. 9B, it is possible to use the trapezoidal support base 16B having a flat top portion of the inverted V-shape, so as to mount a third LED chip 12C to the flat top portion in addition to the LED chips 12A and 12B mounted on the two inclined planes, for constituting the LED light source 1Ac. This LED light source 1Ac can also diffuse light in a predetermined range by the LED chips 12A and 12B emitting light in different directions inclined with respect to the mounting plane of the sub mount substrate 11.

In this way, by using the trapezoidal support base 16B having the flat top portion and the two inclined planes so as to arrange the three LED chips on the three planes facing in different directions, it is possible to provide a light emission distribution that is diffused in a desired range, namely in a quasi-square shape, for example.

Figure 10A:
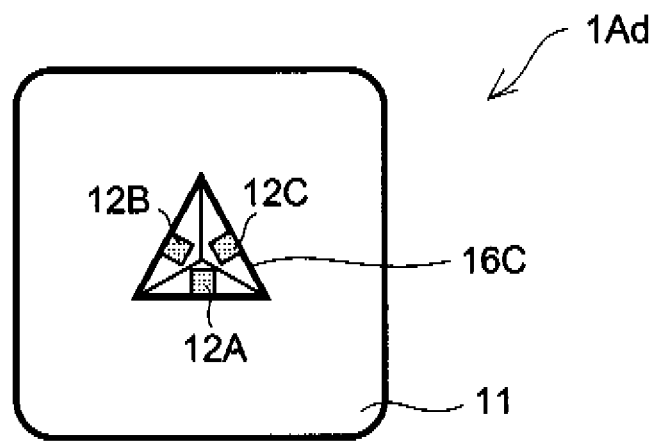
FIG. 10A is a plan view illustrating a third example of the support base according to the present invention.
Figure 10B:
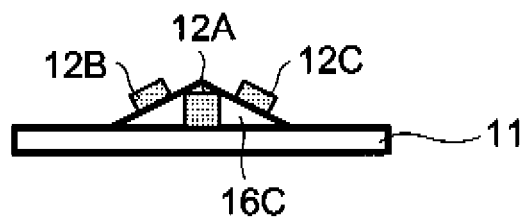
FIG. 10B is a side view of the support base of FIG. 10A.

In addition, as illustrated in a plan view of FIG. 10A and in a side view of FIG. 10B, it is possible to use the triangular pyramid support base 16C having three inclined planes, so as to mount the three LED chips 12A, 12B, and 12C, for constituting the LED light source 1Ad. This LED light source 1Ad can also diffuse light in a predetermined range.

In this way, by using the triangular pyramid support base 16C having the three inclined planes so as to arrange the three LED chips on the three planes facing in different directions, it is possible to provide a light emission distribution that is diffused in a desired range, namely in a quasi-square shape, for example.

Figure 11A:
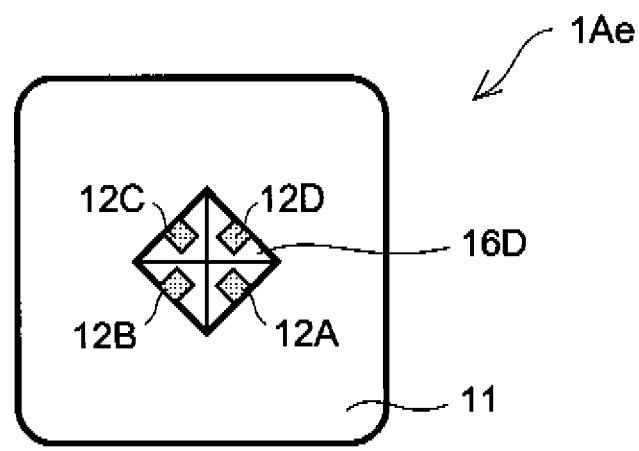
FIG. 11A is a plan view illustrating a fourth example of the support base according to the present invention.
Figure 11B:
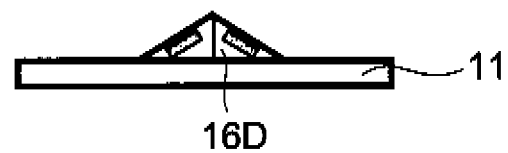
FIG. 11B is a side view of the support base of FIG. 11A.

In addition, as illustrated in a plan view of FIG. 11A and in a side view of FIG. 11B, it is possible to use the square pyramid support base 16D having four inclined planes, so as to mount the four LED chips 12A, 12B, 12C, and 12D, for constituting an LED light source 1Ae. This LED light source 1Ae can also diffuse light in a predetermined range.

In this way, by using the square pyramid support base 16D having the four inclined planes so as to arrange the four LED chips on the four planes facing different directions, it is possible to provide a light emission distribution that is diffused in a desired range, namely in a substantially square shape, for example.

In addition, it is also possible to adopt a structure in which the square pyramid has a flat top portion so as to further dispose a fifth LED chip. Thus, five LED chips are arranged on total five planes including the four inclined planes of the square pyramid and the top portion, and hence it is possible to provide the light emission distribution diffused in a desired range, in a substantially square shape.

As described above, by using the support base 16 (16A, 16B, 16C, or 16D) having the inclined planes for emitting light rays of the plurality of LED chips in different directions, the light is not emitted at 0 degrees and the vicinity with respect to the mounting plane but is emitted to be close to the mounting plane by the diffusion. In other words, because the plurality of LED chips emit light rays in the different directions by the support base 16, the light can be diffused in a predetermined direction.

The LED chip is a predetermined LED chip that emits first light of monochrome, for example. In addition, a sealing resin, which contains a predetermined fluorescent material for emitting second light and/or third light having different colors excited by the first light, is used so as to obtain a LED light source for emitting white color light as mixture of the light colors.

For instance, the LED chip is a blue color LED chip, and the fluorescent material is a fluorescent material having a light emission peak in the yellow color region. With this structure, by using the blue color LED chip and the sealing resin to which the yellow color fluorescent material is added, it is possible to provide the illumination device including the LED light sources enabling white color planar emission with uniform light intensity.

In addition, the LED chip is the blue color LED chip, and the fluorescent material may be a fluorescent material having light emission peaks in the green color region and in the red color region. With this structure, too, by using the blue color LED chip and the sealing resin to which the green color fluorescent material and the red color fluorescent material are added, it is possible to perform white color planar emission with uniform light intensity.

Further, the point-like light source may have a structure for emitting white color light by adding a fluorescent material having a light emission peak in the green color region to the blue color LED chip and by combining the same with a red color LED chip. With this structure, too, it is possible to provide the illumination device including the LED light sources enabling white color planar emission.

In addition, it is possible that the LED light source has a structure in which the LED chip includes the blue color LED chip for emitting blue color light, the red color LED chip for emitting red color light, and a green color LED chip for emitting green color, and these light colors are mixed so as to emit white color light.

Figure 12:
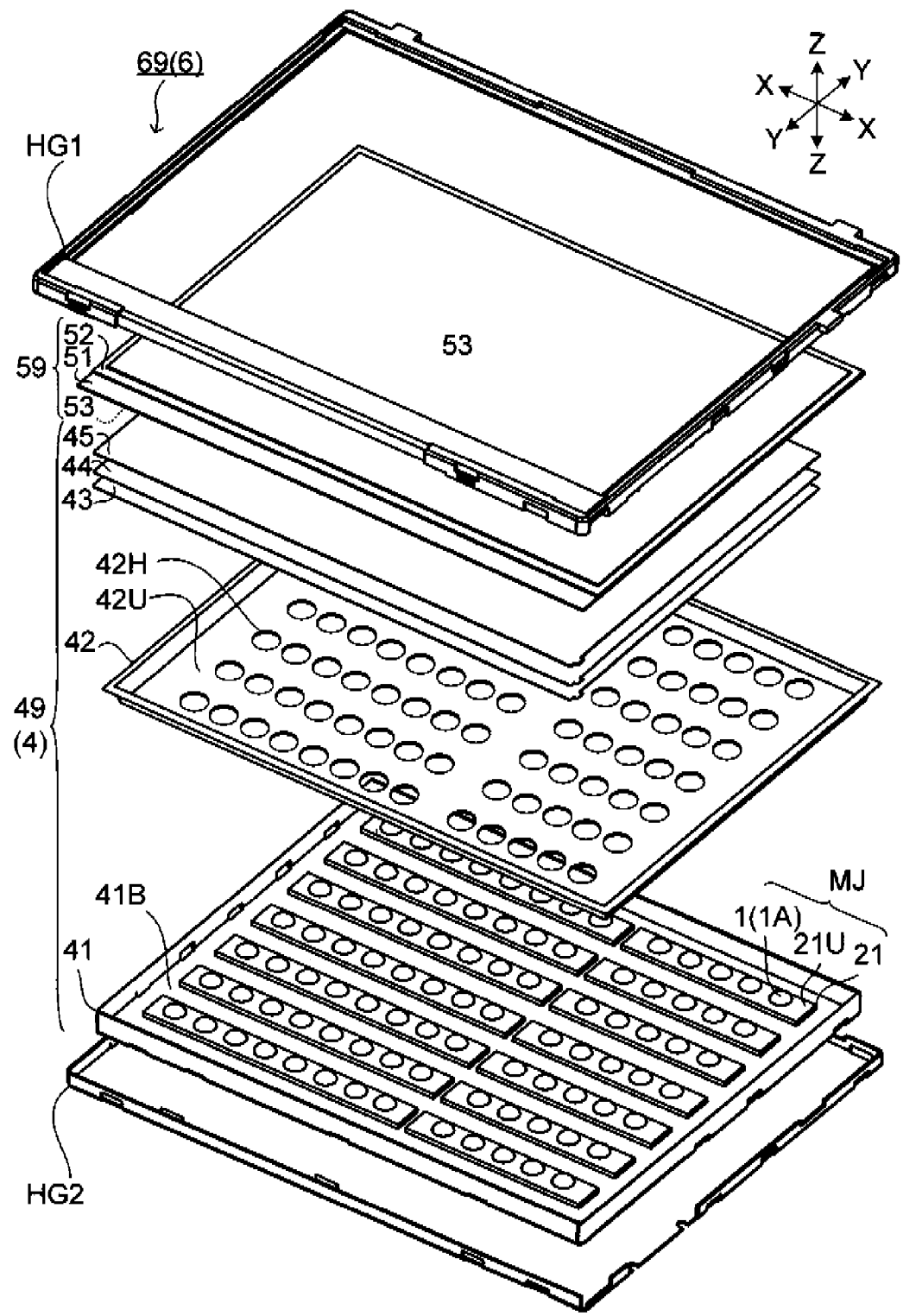
FIG. 12 is an exploded perspective view of a liquid crystal display device.

In this way, by using the LED light sources emitting white color light, the illumination device to be the backlight device can be constituted. Therefore, the illumination device according to this embodiment is an illumination device 4 in which the point-like light source (LED light source) 1 of the LED backlight device 49 illustrated in FIG. 12 is replaced with the LED light source 1A (1Aa to 1Ae) diffused to have the square-shaped light emission distribution, and other structure is the same. Therefore, the illumination device 4 is described with reference to FIG. 12. In addition, a liquid crystal display device 6 is described, which is a display device equipped with the illumination device 4 and the liquid crystal panel 59.

As described above, the illumination device according to this embodiment 4 is equipped with the LED light sources as the point-like light sources diffusing emitted light to have a square-shaped light emission distribution, and includes the mounting substrate on which the LED light sources are mounted. Then, the above-mentioned LED light sources 1A (1Aa to 1Ae) are used as the LED light sources. In addition, when a plurality of the LED light sources 1A are arranged at a predetermined pitch on the mounting substrate 21, the plurality of point-like light sources are arranged so that the square-shaped light emission distributions of the diffused light rays from the LED light sources 1A are overlapped in parallel.

With the above-mentioned structure, because light from each of the plurality of LED light sources 1A is diffused in a square shape, also when the plurality of LED light sources are arranged in a lattice, for example, it is possible to provide the illumination device 4 enabling uniform planar emission in which light intensity is not decreased in the overlapped portion of the light rays from the plurality of LED light sources, by aligning the light emission distributions of each row in parallel, and by emitting the diffused light rays from the light sources also to the overlapped portion outside the lattice.

In addition, to arrange the plurality of LED light sources 1A so that the light emission distributions thereof become parallel to each other means to arrange the light emission distributions of the plurality of LED light sources 1A in a matrix in parallel so as to be arranged in a planar manner, or to arrange the plurality of LED light sources 1A in a lattice or in a staggered manner. In particular, when the plurality of LED light sources 1A are arranged in a lattice, a distance between the light sources in the diagonal direction is longer than a distance between the light sources in the left and right direction. Therefore, by using the LED light source 1A having the square-shaped light emission distribution of this embodiment, a decreased luminance portion is not generated so that uniform planar emission can be performed.

In addition, it is preferred to arrange the plurality of LED light sources 1A in a lattice so that the light emission distributions of the LED light sources 1A neighboring in the up and down direction or in the left and right direction have sides of the square shapes overlapped with each other in parallel, and that the diffused light rays are overlapped also in the center portion in which the diagonal lines of the four LED light sources 1A arranged in a lattice are intersected. With this structure, it is possible to provide the illumination device 4 having uniform luminance without a decreased luminance portion in the planar emission body in which the plurality of LED light sources 1A as the point-like light sources are arranged at a predetermined pitch.

As described above, the plurality of point-like light sources used for the illumination device 4 are linearly arranged along the longitudinal direction of the mounting substrate 21 so that the square-shaped light emission distributions are overlapped in parallel. With this structure, the light emission distributions can be easily overlapped in parallel by linearly arranging the point-like light sources. Therefore, it is possible to realize uniform planar emission in which light intensity is not decreased in the overlapping portion.

In addition, the plurality of point-like light sources are arranged in a lattice so that light emission distributions of the point-like light sources neighboring in the up and down direction or in the left and right direction are overlapped in parallel in each side of the square-shape, and the diffused light rays are overlapped also in the center portion of the four point-like light sources arranged in a lattice. With this structure, the light emission distributions of the plurality of point-like light sources arranged in a lattice are overlapped in parallel. Therefore, it is possible to provide the illumination device 4 enabling uniform planar emission, in which light intensity is not decreased in the overlapping portion, even if the light emission device has a large area.

In addition, it is preferred to mount the plurality of point-like light sources at equal spaces on the mounting substrate 21. With this structure, because the point-like light sources diffusing in a predetermined range are arranged at equal spaces, the outside portions of the diffused light rays can be securely overlapped. Therefore, it is possible to provide the illumination device enabling uniform planar emission in which light intensity in the overlapping portion of light rays from the plurality of point-like light sources is not decreased.

In addition, it is preferred to arrange the mounting substrates in a plurality of rows along the longitudinal direction. With this structure, using this mounting substrate, light intensity in the overlapping portion of light rays from the plurality of point-like light sources is not decreased, it is possible to provide the illumination device 4 enabling uniform planar emission, even if the light emission device has a large area.

In addition, because it is sufficient if the plurality of point-like light sources are arranged in a lattice in the installed state, it is preferred to arrange the plurality of point-like light sources in a lattice on the plurality of the arranged mounting substrates. With this structure, because the point-like light sources are arranged in a lattice in the installed state of the plurality of substrates, it is possible to provide the illumination device 4 enabling uniform planar emission, in which the light emission distributions of the plurality of point-like light sources arranged in a lattice are overlapped in parallel so that light intensity is not decreased.

In addition, the plurality of point-like light sources may be arranged in a lattice on the mounting substrate on which the point-like light sources are mounted. With this structure, because the plurality of point-like light sources are arranged in a lattice on the mounting substrate, it is possible to provide the illumination device 4 enabling uniform planar emission, in which light emission distributions of the plurality of point-like light sources arranged in a lattice are overlapped in parallel so that light intensity is not decreased.

In this way, the LED light source 1A diffusing light to have a square-shaped light emission distribution is suitable for, in particular, the illumination device 4 (LED backlight device) having a structure in which the LED light sources 1A are arranged in a lattice.

In addition, the display device, which includes the illumination device 4 equipped with the LED light source 1A (1Aa to 1Ae) and a display panel, can include the illumination device of uniform light emission luminance. Therefore, it is possible to provide a display device having improved display quality. In addition, because the light from each of the point-like light sources is diffused, it is possible to reduce the number of light sources to be installed, and hence it is possible to preferably provide the display device that can reduce cost.

In addition, if the display panel is the liquid crystal panel 59 using liquid crystal, the liquid crystal display device 6, which includes the illumination device 4 equipped with LED light sources 1A (1Aa to 1Ae) according to this embodiment and the liquid crystal panel 59, can stabilize light emission luminance without a decreased luminance portion so as to improve reliability. In addition, because light of each LED light source 1A is diffused, the number of the LED light sources 1A to be installed can be reduced, and hence it is possible to preferably provide the display device that can reduce cost.

Figure 13:
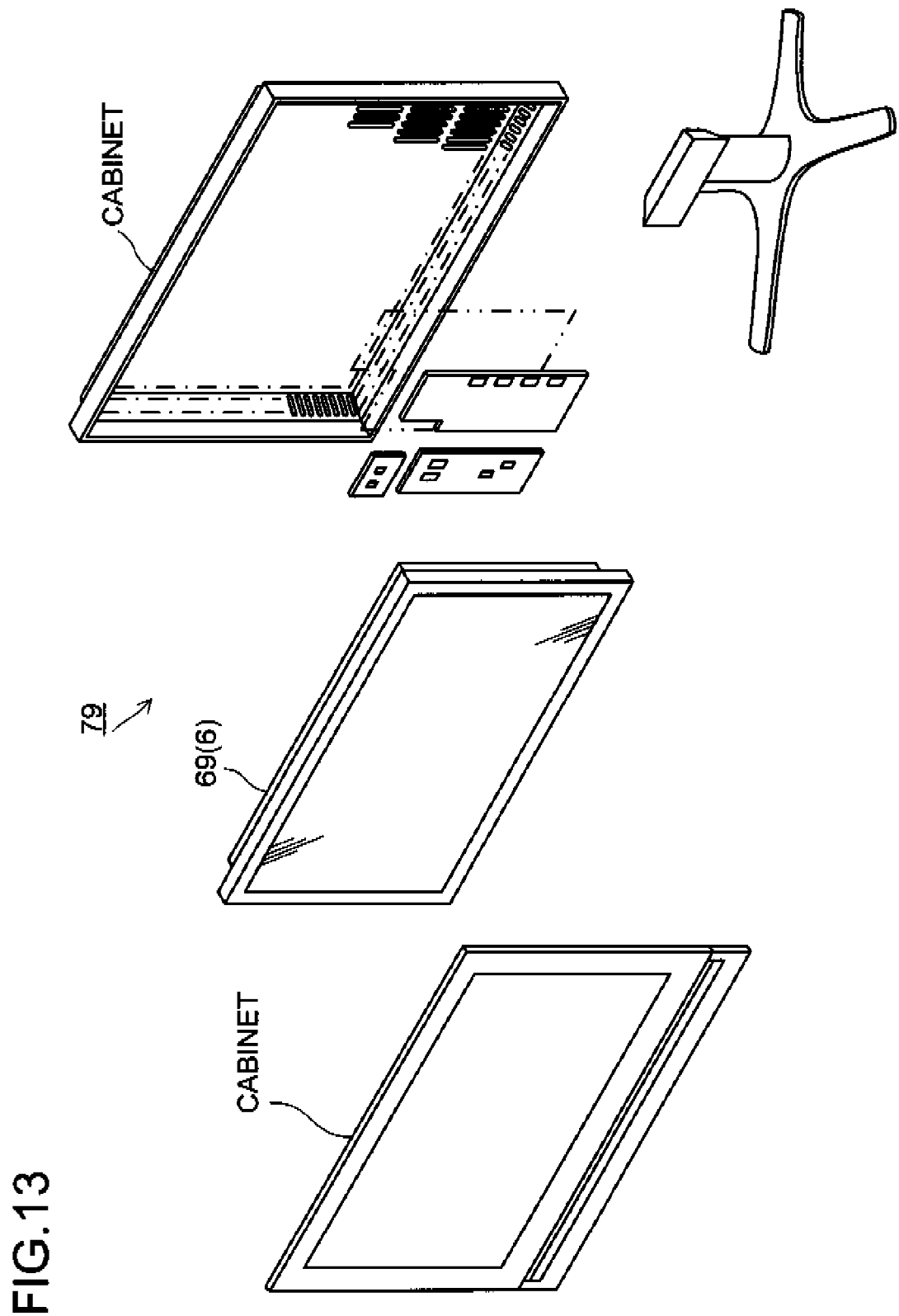
FIG. 13 is an exploded perspective view of a television receiving device equipped with the liquid crystal display device.

The liquid crystal display device 6 can be used as a display portion of a liquid crystal television set 79 as illustrated in FIG. 13, for example. Note that such the liquid crystal television set 79 receives a television broadcasting signal and displays images, and can be said to be a television receiving device.

As described above, according to the present invention, the illumination device uses the point-like light sources diffusing emitted light to have square-shaped light emission distribution. Therefore, when the plurality of point-like light sources are planarly arranged in a matrix, they are arranged so that the light emission distributions thereof are overlapped in parallel, and hence the diffused light of the point-like light sources are mixed in the outside portion. Thus, it is possible to provide the illumination device enabling uniform planar emission without a decreased luminance portion between the plurality of point-like light sources, in which light intensity is not decreased.

In this case, it is sufficient that the point-like light source is a self-emitting light emission element. For instance, an LED light source constituted of an LED package using an LED chip can be used. Therefore, as long as the illumination device uses the LED light source diffusing light to have a square-shaped light emission distribution, it is possible to provide the illumination device (LED backlight device) enabling uniform planar emission, in which light intensity is not decreased in the overlapped portion of the light rays from the plurality of LED light sources.

In addition, the (liquid crystal) display device including the illumination device (LED backlight device) can stabilize light emission luminance without a decreased luminance portion so as to improve reliability. In addition, light from each LED light source is diffused, the number of the LEDs to be installed can be reduced, and hence cost can be reduced.

INDUSTRIAL APPLICABILITY

Therefore, the illumination device according to the present invention can be appropriately used as an illumination device (LED backlight device) for a liquid crystal display device, which can stabilize light emission luminance and improve reliability even if the number of LED light sources to be installed is reduced.

EXPLANATION OF NUMERALS 1 point-like light source
1A LED light source (point-like light source according to the present invention)
1B LED light source (point-like light source of the conventional structure)
4 illumination device (LED backlight device)
6 (liquid crystal) display device
11 sub mount substrate
12 LED chip
14 sealing resin
15 diffusing lens
15A diffusing lens (according to the present invention)
16 support base
16A inverted V-shaped support base
16B trapezoidal support base
16C triangular pyramid support base
16D square pyramid support base
49 LED backlight device (illumination device)
59 liquid crystal panel
69 liquid crystal display device
H1 light emission distribution
HR1 directivity characteristics

The invention claimed is:
1. An illumination device, comprising:
a plurality of point-like light sources; and
a mounting substrate on which the point-like light sources are mounted, wherein light emitted from each of the point-like light sources is diffused to have a square-shaped light emission distribution, and each of the point-like light sources is constituted of an LED package including an LED chip as a light source, a sub mount substrate on which the LED chip is mounted, and a sealing resin for sealing the LED chip.

2. The illumination device according to claim 1, wherein the plurality of point-like light sources are arranged linearly in a longitudinal direction of the mounting substrate so that the square-shaped light emission distributions are overlapped in parallel.

3. The illumination device according to claim 1, wherein the plurality of point-like light sources are arranged in a lattice pattern, light emission distributions of the point-like light sources neighboring in a up and down direction and in a left and right direction are overlapped in parallel at each side of the square shape, and diffused light rays of four point-like light sources arranged in a lattice overlap with each other also at the center thereof.

4. The illumination device according to claim 1, wherein the plurality of point-like light sources are mounted at equal spaces on the mounting substrate.

5. The illumination device according to claim 1, wherein a plurality of mounting substrates are arranged in a plurality of rows along a longitudinal direction.

6. The illumination device according to claim 5, wherein the plurality of point-like light sources are arranged in a lattice pattern on the plurality of arranged mounting substrates.

7. The illumination device according to claim 1, wherein the plurality of point-like light sources are arranged in a lattice pattern on the mounting substrate on which the point-like light sources are mounted.

8. The illumination device according to claim 1, wherein each of the point-like light sources further includes a diffusing lens which diffuses the light emitted from the LED chip and through the sealing resin to have the square-shaped light emission distribution.

9. The illumination device according to claim 1, wherein the sealing resin is set in a shape such that the light emitted from the LED chip is diffused to have the square-shaped light emission distribution.

10. The illumination device according to claim 1, wherein a plurality of LED chips are mounted on the sub mount substrate via a support base having inclined planes so that the plurality of LED chips have different light emission directions.

11. The illumination device according to claim 10, wherein the support base is an inverted V-shaped support base having two inclined planes.

12. The illumination device according to claim 10, wherein the support base is a triangular pyramid support base having three inclined planes.

13. The illumination device according to claim 10, wherein the support base is a square pyramid support base having four inclined planes.

14. A display device comprising:
an illumination device according to claim 1; and
a display panel which performs a display by using light from the illumination device.

15. The display device according to claim 14, wherein the display panel is a liquid crystal panel using liquid crystal.

16. A television receiving device comprising the display device according to claim 14.

17. An LED light source for use as a point-like light source included in an illumination device, the illumination device comprising a plurality of point-like light sources and a mounting substrate on which the point-like light sources are mounted, wherein light emitted from each of the point-like light sources is diffused to have a square-shaped light emission distribution, the LED light source being constituted of an LED package comprising:
an LED chip as a light source;
a sub mount substrate on which the LED chip is mounted; and
a sealing resin for sealing the LED chip,
wherein
emitted light from the LED light source is diffused to have the square-shaped light emission distribution.

* * * * *